United States Patent
Hu et al.

(10) Patent No.: US 6,660,627 B2
(45) Date of Patent: Dec. 9, 2003

(54) METHOD FOR PLANARIZATION OF WAFERS WITH HIGH SELECTIVITIES

(75) Inventors: Shao-Chung Hu, Taipei (TW); Hsueh-Chung Chen, Taipei Hsien (TW); Shih-Hsun Hsu, Chi-Lung (TW); Chia-Lin Hsu, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/063,133

(22) Filed: Mar. 25, 2002

(65) Prior Publication Data

US 2003/0181050 A1 Sep. 25, 2003

(51) Int. Cl.$^7$ .......................................... H01L 21/4763
(52) U.S. Cl. ................ 438/624; 438/627; 438/634; 438/643; 438/653; 438/671; 438/687
(58) Field of Search ................. 438/624, 627, 438/634, 643, 653, 671, 687; 257/751, 752, 637, 760

(56) References Cited

U.S. PATENT DOCUMENTS 6,037,664 A * 3/2000 Zhao et al. .................. 257/758
6,440,840 B1 * 8/2002 Chen ........................... 438/624

* cited by examiner

Primary Examiner—W. David Coleman
Assistant Examiner—Hsien Ming Lee
(74) Attorney, Agent, or Firm—Winston Hsu

(57) ABSTRACT

A method for planarization of a semiconductor wafer with a high selectivity is describe. The semiconductor wafer has a hard mask, a stop layer disposed on the hard mask, and a barrier layer disposed on the stop layer. The method includes performing a chemical mechanical polishing (CMP) process on the barrier layer so as to expose the stop layer, and removing the stop layer. The polishing selectivity of the barrier layer relative to the stop layer is greater than 50. Since the material of stop layer is different from the material of barrier layer, the high selectivity is easily achieved. Thus, the surface of semiconductor wafer can be highly planarized.

24 Claims, 8 Drawing Sheets

METHOD FOR PLANARIZATION OF WAFERS WITH HIGH SELECTIVITIES

BACKGROUND OF THE INVENTION

1. Field of the Invention

The invention relates to a method for planarization of a semiconductor wafer, and more particularly, to a method for planarization of a semiconductor wafer with a high selectivity utilized in a semiconductor process.

2. Description of the Prior Art

When fabricating modern semiconductor integrated circuits (ICs) in the deep sub-micro field, to prevent subsequent manufacturing processes from being adversely affected, the planarization of each deposition layer of an integrated circuit has to be considered. In fact, most high-density IC fabrication techniques make use of some method to form a planarized wafer surface at critical points in the manufacturing process. One method for achieving semiconductor wafer planarization or topography removal is the chemical mechanical polishing (CMP) process. The CMP process has become an indispensable technique for removing materials on a semiconductor wafer in the back end of the line (BEOL) interconnect process. Especially, since the etching technique for copper has not yet matured, for forming copper wires in an integrated circuit, the CMP process seems to be the only one planarization techniques utilized in the copper interconnect process.

Please refer to FIG. 1. FIG. 1 is a schematic diagram of a copper-damascene structure 10 according to a prior art. The prior art copper-damascene structure 10 includes a first dielectric layer 12, a first conductive layer 14, a cap layer 16, a second dielectric layer 18, a hard mask 20, a barrier layer 22, a second conductive layer 24, and a via plug 26. The first conductive layer 14 is composed of metal, and the cap layer 16 is typically composed of silicon nitride (SiN). Furthermore, the second dielectric layer 18 is composed of low dielectric constant material, and the hard mask 20 is made from fluorinated silicate glass (FSG) having a low dielectric constant or typical photoresist material, such as $SiO_2$, SiN, SiON, SiC, SiCO, or SiOCN. Additionally, the barrier layer 22 is composed of Ta, TaN, or other conventional barrier material, and both of the second conductive layer 24 and the via plug 26 are made from copper. Thereafter, the copper-damascene structure 10 has a chemical mechanical polishing (CMP) process performed on it to remove the second conductive layer 24 and the portion of barrier layer 22 disposed on the surface of hard mask 20 so as to complete the fabrication of a copper interconnect.

For ensuring the portion of barrier layer 22 disposed on the surface of hard mask 20 can be removed completely, when the CMP process is performed on the barrier layer 22, the copper-damascene structure 10 has to be over polished appropriately. However, since slurry used currently has similar chemical characteristics with respect to the barrier layer 22 and the hard mask 20, a removal rate of the barrier layer 22 is close to a removal rate of the hard mask 20 during the CMP process. Therefore, a polishing selectivity for the removal rate of the barrier layer 22 is very small with respect to the hard mask 20 during the CMP process. The so-called polishing selectivity is defined by a ratio of the removal rate of the barrier layer 22 to the removal rate of the hard mask 20. Typically, the polishing selectivity is smaller than 5. Hence, when the barrier layer 22 of the prior art copper-damascene structure 10 is polished by the CMP process, the hard mask 20 is inevitably polished by the CMP process as well, leading to a thickness of a damaged portion of the hard mask 20 being 300 to 1000 Å. Additionally, the uniformity of the polished surface of the copper-damascene structure 10 may exceed 10% and thus adversely affect the electrical performance of the copper-damascene structure 10. Moreover, the roughness of the polished surface of the copper-damascene structure 10 causes difficulty in the fabrication of high-level layers when manufacturing a multi-level metal interconnect structure.

SUMMARY OF THE INVENTION

It is therefore a primary objective of the claimed invention to provide a method for planarization of a semiconductor wafer with a high selectivity to solve the above-mentioned problem.

According to the claimed invention, a method for planarization of a semiconductor wafer is disclosed. The semiconductor wafer has a hard mask, a stop layer disposed on the hard mask, and a barrier layer disposed on the stop layer. The method comprises performing a first chemical mechanical polishing (CMP) process on the barrier layer to expose the stop layer, and removing the stop layer. A polishing selectivity for a removal rate of the barrier layer is greater than 50 with respect to the stop layer during the first CMP process. According to the claimed invention, the polishing selectivity for the removal rate of the barrier layer is greater than 100 with respect to the stop layer via selecting appropriate material of the stop layer during the first CMP process.

It is an advantage of the claimed invention that the stop layer is placed in between the hard mask and the barrier layer and the removal rate of the stop layer is substantially different from the removal rate of the barrier layer due to the material of the stop layer. Thus, the prior art problem of loss of the hard mask due to the low polishing selectivity is effectively eliminated. Meanwhile, the surface of semiconductor wafer can be highly planarized through the high selectivity provided by the claimed invention. Furthermore, the process margin can be substantially increased and thus the quality of the semiconductor wafer can be effectively controlled.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
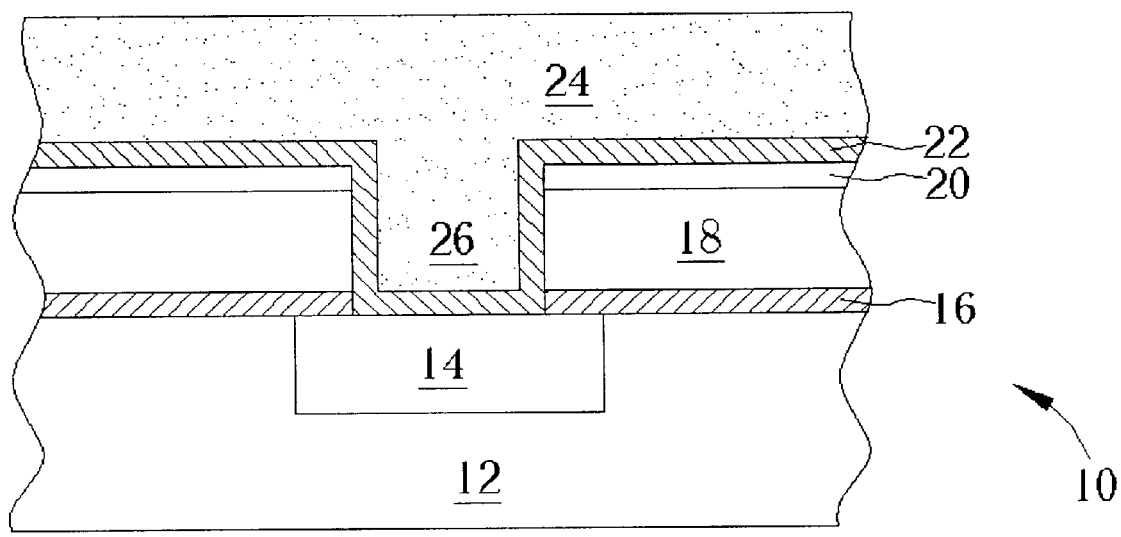
FIG. 1 is a schematic diagram of a copper-damascene structure according to a prior art.
Figure 2A:
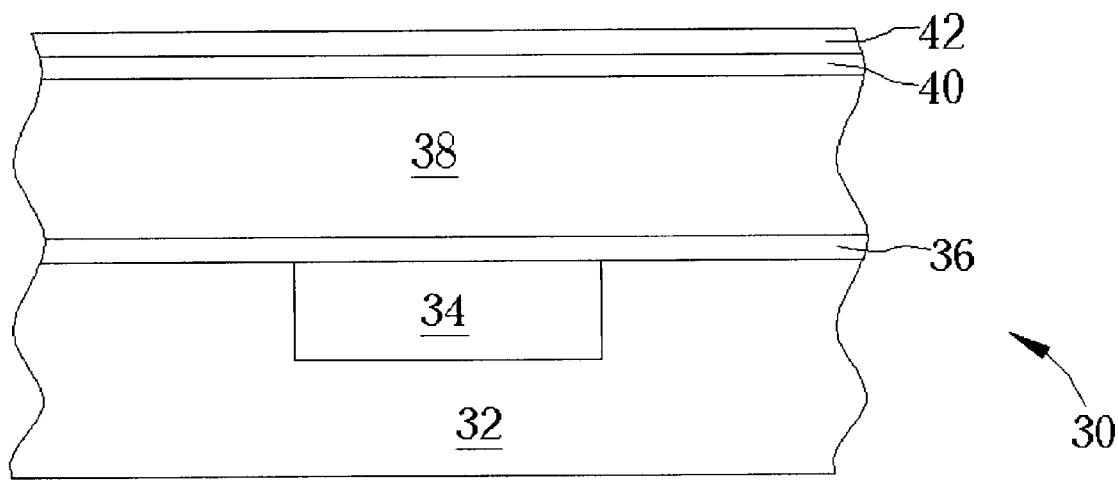
FIGS. 2A to 2F are schematic diagrams of a method for planarization of a semiconductor wafer according to the present invention.

Please refer to FIGS. 2A to 2F. FIGS. 2A to 2F are schematic diagrams of a method for planarization of a semiconductor wafer 30 according to the present invention. As shown in FIG. 2A, the semiconductor wafer 30 has a first dielectric layer 32, a first conductive layer 34, and a cap layer 36 formed thereon. Then, a second dielectric layer 38 is formed on the cap layer 36, a hard mask 40 is formed on the second dielectric layer 38, and a stop layer 42 is formed on the hard mask 40 sequentially. The first conductive layer 34 is composed of metal, and the cap layer 36 is typically composed of silicon nitride (SiN). Furthermore, the second dielectric layer 38 is composed of a low dielectric constant material, for example, SiLK™ or FLARE™. The hard mask 40 is made from typical photoresist material, such as $SiO_2$, SiN, SiON, SiC, SiCO, or SiOCN and has a thickness that is smaller than 1000 Å. Incidentally, processes for forming the above-mentioned layers are well known by those who skilled in the art and are not described in detail for preventing the spirit of the present invention from being obscured.

The stop layer 42 of the present invention is composed of organic polymer material. According to a preferred embodiment of the present invention, the organic polymer material is aromatic polymer material such as SiLK™, or fluorocarbon polymer material such as FLARE™. Moreover, the stop layer 42 is formed by a chemical vapor deposition (CVD) process or a spin on deposition (SOD) process. Meanwhile, a thickness of the stop layer 42 is smaller than 1000 Å. Preferably, the thickness of the stop layer 42 is between 200 to 400 Å.

Figure 2B:
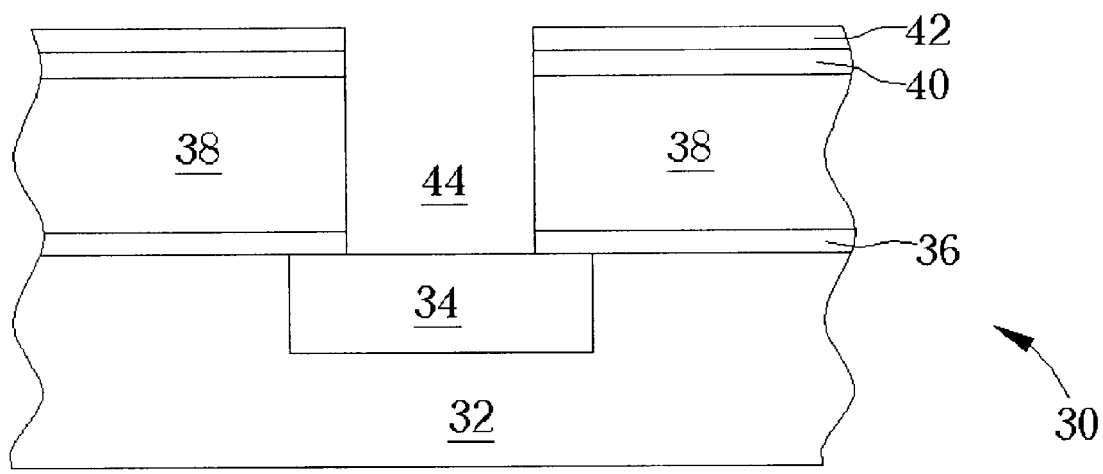

Then, as shown in FIG. 2B, a via opening 44 is defined extending from the stop layer 42 to the cap layer 36 until the surface of the first conductive layer 34 in the semiconductor wafer 30. The via opening 44 is formed by a conventional lithography and etching process.

Figure 2C:
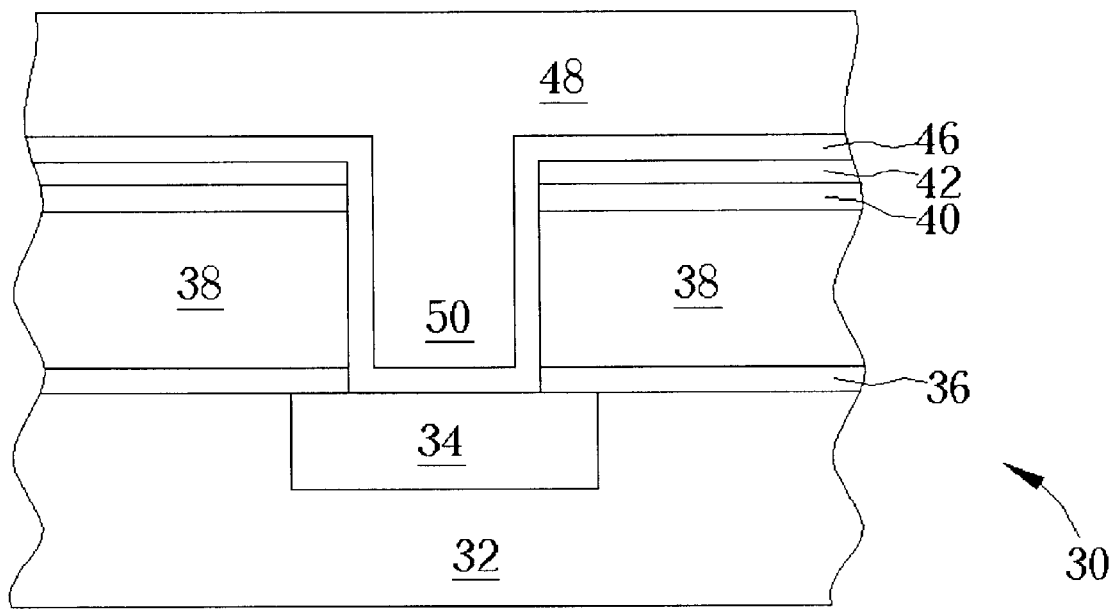

Please refer to FIG. 2C. After the via opening 44 has been formed, a barrier layer 46 is formed on the surface of the stop layer 42 and sidewalls and a bottom surface of the via opening 44. Thereafter, a second conductive layer 48 is formed on the barrier layer 46 and filled into the via opening 44 so as to form a via plug 50. According to the preferred embodiment of the present invention, the barrier layer 46 is selected from a group consisting of TaN, Ta, Ti, TiN, TiSiN, W, WN, or any combination thereof and has a thickness that is smaller than 1000 Å. Additionally, both the second conductive layer 48 and the via plug 50 are made from copper by an electrical copper plating (ECP) process or other copper deposition methods.

Figure 2D:
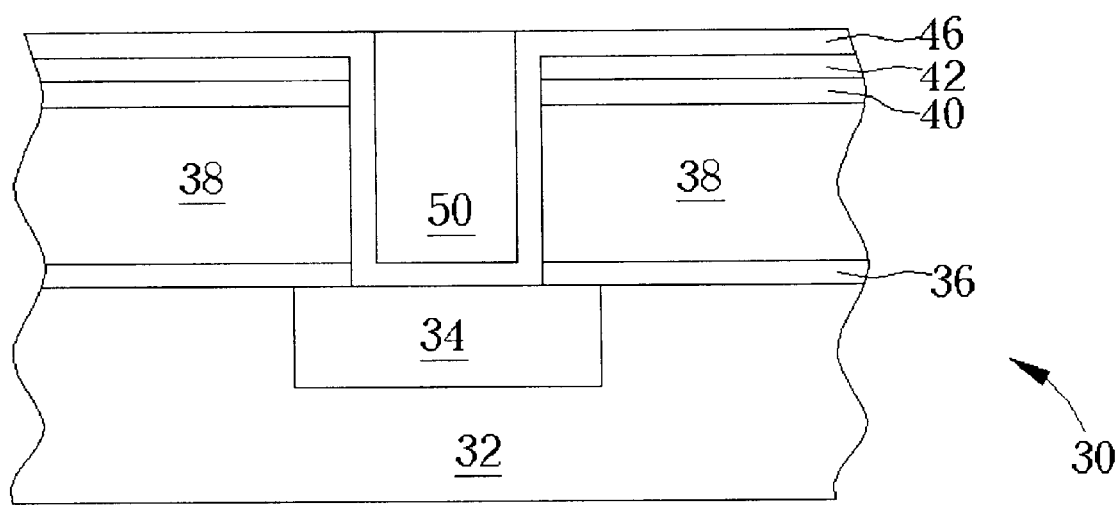
Figure 2E:
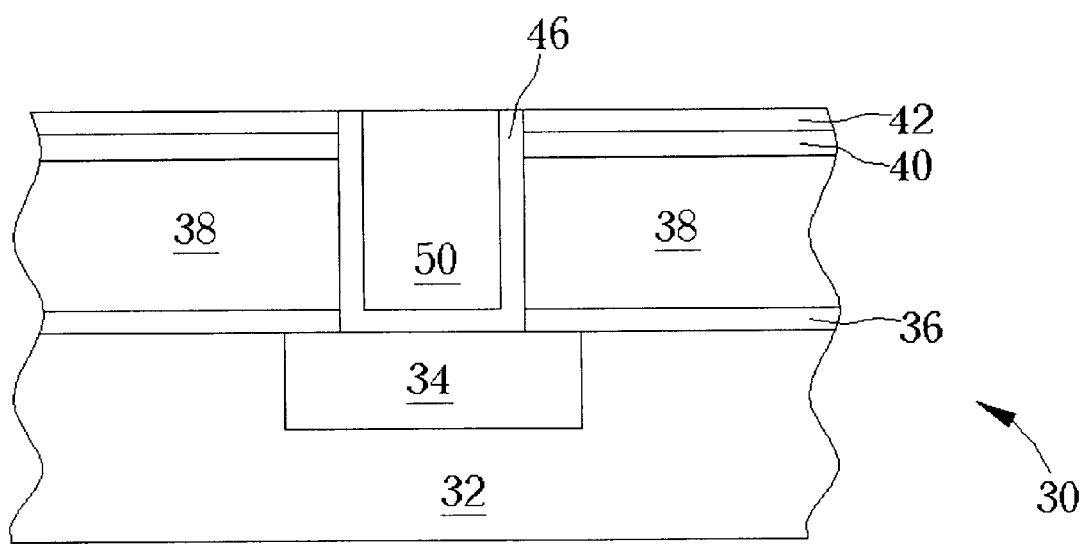

Thereafter, as shown in FIG. 2D, the second conductive layer 48, i.e., the copper layer, has a first chemical mechanical polishing (CMP) process performed on it for exposing the barrier layer 46 and the via plug 50. When the CMP process of the copper layer is completed, the method of planarization continues. As shown in FIG. 2E, a second CMP process is performed on the barrier layer 46 so as to expose the stop layer 42. The mechanism of the second CMP process generates chemical reactions on the surface of the barrier layer 46 from the material of the barrier layer 46 and appropriate chemicals, which are slurry with a suitable pH value and a related oxidizer. Meanwhile, an appropriate solvent is utilized for generating considerable affinity between the surface of the barrier layer 46 and abrasive particles of the slurry. Then, a mechanical strength of 0.5 to 10 psi provided by a polishing pad is exerted so as to execute the second CMP process. According to the preferred embodiment of the present invention, a polishing apparatus is the Mirra Mesa polishing machine available from the Applied Materials or the polishing machine of type 776 available from the SpeedFam-IPEC Company. The polishing pad is the K-XY GROOVE polishing pad from the Rodel IC series made from polyurethane (PU) foam. The slurry is the base slurry Rodel-1501 having silica as the abrasive particles.

Surely, the present invention is not restricted in utilizing the above-mentioned polishing apparatus, polishing pad, and slurry only. Taking slurry as an example, for achieving the high polishing selectivity, any slurry having chemical composition that is incapable of generating chemical reactions on the stop layer 42 when the barrier layer 46 is polished can also be utilized in the present invention. According to the above-mentioned conditions of the preferred embodiment of the present invention, the polishing selectivity for the removal rate of the barrier layer 46 is greater than 100 with respect to the stop layer 42 during the second CMP process when the barrier layer 46 is composed of tantalum nitride (TaN). Thus, the loss of the stop layer 42 can be effectively prevented. Furthermore, when polishing the barrier layer 46, the mechanical strength of the material of the stop layer 42 is at least 100 times of the normally utilized polishing pressure. Therefore, through controlling the polishing conditions appropriately, the possibility of delamination of the stop layer 42 can also be effectively eliminated.

Figure 2F:
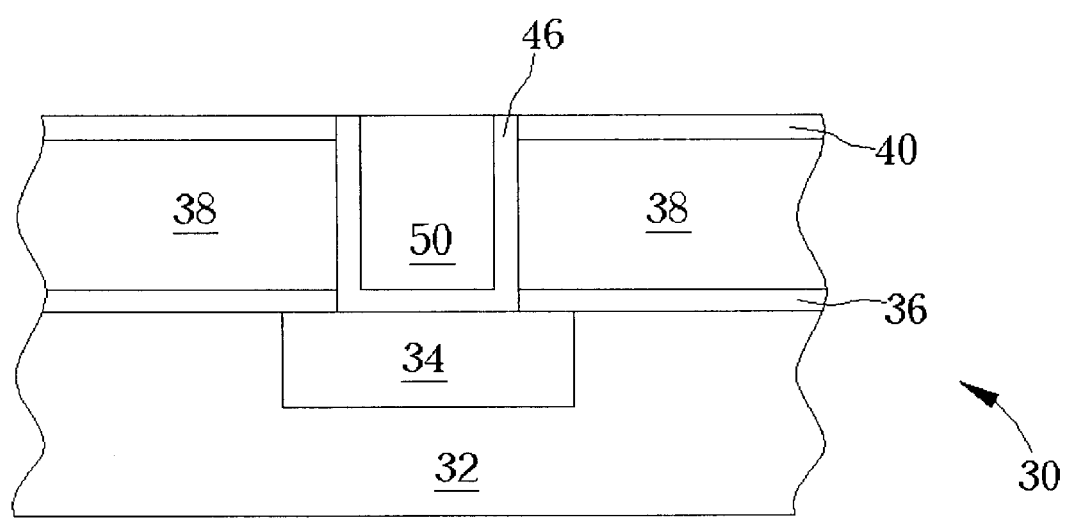

Please refer to FIG. 2F. When the second CMP process of the barrier layer 46 has been completed, then the stop layer 42 is removed. According to the preferred embodiment of the present invention, the stop layer 42 may be removed by a third CMP process. For achieving a polishing selectivity for a removal rate of the stop layer 42 greater than 5 with respect to the hard mask 40 during the third CMP process, acid slurry Cabot-4200 having alumina as abrasive particles may be utilized as slurry during the third CMP process. Likewise, the so-called polishing selectivity is defined as a ratio of the removal rate of the stop layer 42 and a removal rate of the hard mask 40. Additionally, the stop layer 42 may also be removed by a dry etching process or a wet etching process. At this time, according to the preferred embodiment, the dry etching process is performed by mainly utilizing $N_2/)O_2$ mixed gas, and the wet etching process is performed by fluorine base solvent.

Figure 3:
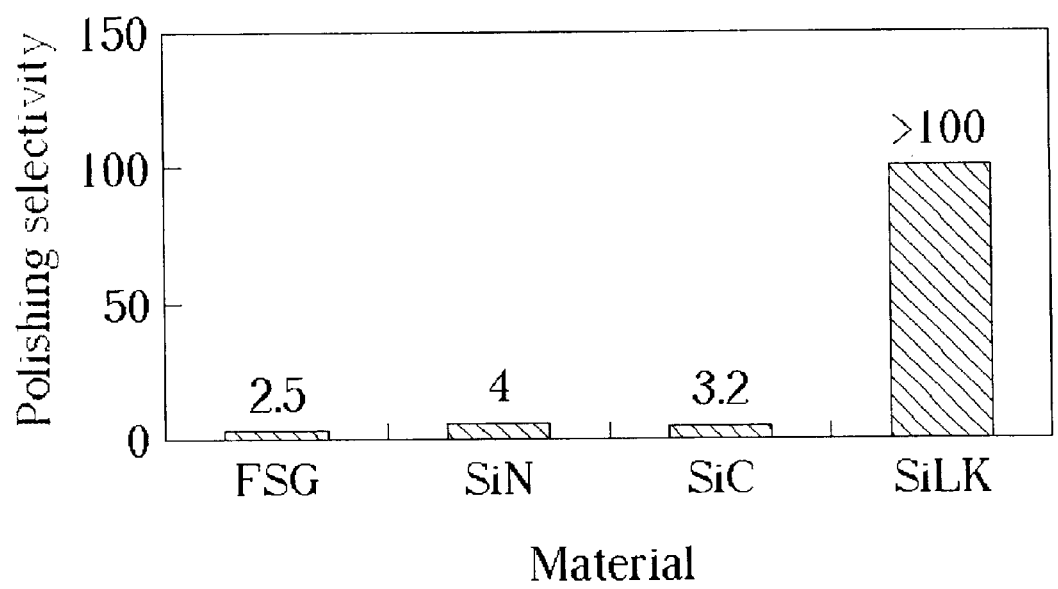
FIG. 3 is a correlation diagram illustrating the polishing selectivity of the barrier layer with respect to various hard masks and the stop layer according to the present invention.

Please refer to FIG. 3. FIG. 3 is a correlation diagram illustrating the polishing selectivity of the barrier layer 46 with respect to various hard masks 40 and the stop layer 42 according to the present invention. The horizontal axis of FIG. 3 represents different materials of the hard mask 40, such as fluorinated silicate glass (FSG), silicon nitride (SiN), and silicon carbide (SiC), and material of the stop layer 42, i.e., SiLK™ formed by the CVD method. The vertical axis of FIG. 3 is the polishing selectivity of the barrier layer 46 composed of TaN with respect to the above-mentioned material of the hard mask 40 and the stop layer 42. Incidentally, the results shown in FIG. 3 are generated from experiments utilizing the Mirra Mesa polishing machine available from the Applied Materials, the K-XY GROOVE polishing pad of the Rodel IC series, and the base slurry Rodel-1501 using silica as the abrasive particles. As shown in FIG. 3, no matter what type of material of the hard mask 40 is, the polishing selectivity of the barrier layer 46 with respect to the hard mask 40 are all smaller than 5. Conversely, the polishing selectivity of the barrier layer 46 with respect to the stop layer 42 is greater than 100. Therefore, the stop layer 42 formed between the hard mask 40 and the barrier layer 46 can cause the method of the present invention to achieve a high selectivity.

In a prior art copper-damascene structure, since slurry used currently has similar chemical characteristics with respect to a barrier layer and a hard mask, a removal rate of the barrier layer is close to a removal rate of the hard mask during a CMP process. Therefore, a polishing selectivity for the removal rate of the barrier layer is very small with respect to the hard mask during the CMP process. Typically, the polishing selectivity is smaller than 5. Hence, when the barrier layer is polished by the CMP process, the hard mask is inevitably polished by the CMP process as well, leading a thickness of a damaged portion of the hard mask being 300 to 1000 Å. Additionally, the uniformity of the polished surface may exceed 10% and thus adversely affect the electrical performance of the prior art copper-damascene structure. Moreover, the roughness of the polished surface of the copper-damascene structure causes the fabrication of high-level layers to be difficult when manufacturing a multi-level metal interconnect structure.

In contrast to the prior art, the method for planarization of a semiconductor wafer according to the present invention places a stop layer in between a hard mask and a barrier layer. Since material of the stop layer is significantly different from material of the barrier layer, the prior art problem of loss of the hard mask due to the low polishing selectivity is effectively eliminated. Meanwhile, the surface of the semiconductor wafer can be highly planarized through the high selectivity provided by the present invention. Furthermore, the process margin can be substantially increased and thus the quality of the semiconductor wafer can be effectively controlled.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for planarlzation of a semiconductor wafer, the semiconductor wafer having a hard mask, a stop layer disposed on the hard mask, and a barrier layer disposed on the stop layer, the stop layer being composed of organic polymer material, the method comprising:
    performing a first chemical mechanical polishing (CMP) process on the barrier layer to expose the stop layer; and
    removing the stop layer;
        wherein a polishing selectivity for a removal rate the barrier layer is greater than 50 with respect to the stop layer during the first CMP process.

2. The method of claim 1 wherein the organic polymer material is aromatic polymer material.

3. The method of claim 1 wherein the organic polymer material is fluorocarbon polymer material.

4. The method of claim 1 wherein the stop layer is formed by a chemical vapor deposition (CVD) process.

5. The method of claim 1 wherein the stop layer is formed by a spin on deposition (SOD) process.

6. The method of claim 1 wherein a thickness of the stop layer is smaller than 1000 Å.

7. The method of claim 1 wherein the semiconductor wafer further comprises a conductive layer disposed on the barrier layer.

8. The method of claim 7 wherein the conductive layer is composed of copper.

9. The method of claim 1 wherein the stop layer is removed by a second chemical mechanical polishing (CMP) process.

10. The method of claim 1 wherein the stop layer is removed by an etching process.

11. The method of claim 1 wherein the barrier layer is selected from a group consisting of TaN, Ta, Ti, TiN, TiSiN, W, WN, or any combination thereof.

12. The method of claim 11 wherein a thickness of the barrier layer is smaller than 1000 Å.

13. A method for planarization of a semiconductor wafer with a high selectivity, the method comprising:
    providing the semiconductor wafer having a first dielectric layer and a cap layer formed thereon;
    forming a second dielectric layer on the cap layer;
    forming a hard mask on the second dielectric layer;
    forming a stop layer on the hard mask;
    forming a barrier layer on the stop layer;
    forming a conductive layer on the barrier layer;
    performing a first chemical mechanical polishing (CMP) process on the conductive layer to expose the barrier layer;
    performing a second chemical mechanical polishing (CMP) process on the barrier layer to expose the stop layer; and
    removing the stop layer;
        wherein a polishing selectivity for a removal rate of the barrier layer is greater than 50 with respect to the stop layer during the second CMP process.

14. The method of claim 13 wherein the stop layer is composed of organic polymer material.

15. The method of claim 14 wherein the organic polymer material is aromatic polymer material.

16. The method of claim 14 wherein the organic polymer material is fluorocarbon polymer material.

17. The method of claim 13 wherein the stop layer is formed by a chemical vapor deposition (CVD) process.

18. The method of claim 13 wherein the stop layer is formed by a spin on deposition (SOD) process.

19. The method of claim 13 wherein a thickness of the stop layer is smaller than 1000 Å.

20. The method of claim 13 wherein the conductive layer is composed of copper.

21. The method of claim 13 wherein the stop layer is removed by a third chemical mechanical polishing (CMP) process.

22. The method of claim 13 wherein the stop layer is removed by an etching process.

23. The method of claim 13 wherein the barrier layer is selected from a group consisting of TaN, Ta, Ti, TiN, TiSiN, W, WN, or any combination thereof.

24. The method of claim 23 wherein a thickness of the barrier layer is smaller than 1000 Å.

* * * * *